(12) United States Patent
Zarkesh-Ha et al.

(10) Patent No.: US 7,014,957 B1
(45) Date of Patent: Mar. 21, 2006

(54) INTERCONNECT ROUTING USING PARALLEL LINES AND METHOD OF MANUFACTURE

(75) Inventors: Paymen Zarkesh-Ha, Fremont, CA (US); Kenneth J Doniger, Menlo Park, CA (US); William M. Loh, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 97 days.

(21) Appl. No.: 10/335,470

(22) Filed: Dec. 31, 2002

(51) Int. Cl.
*G03F 9/00* (2006.01)

(52) U.S. Cl. .................... 430/5; 438/625; 438/631; 438/637

(58) Field of Classification Search .................. 430/5; 438/637, 625, 631
See application file for complete search history.

(56) References Cited

U.S. PATENT DOCUMENTS 6,015,641 A * 1/2000 Chou ........................... 430/5

\* cited by examiner

*Primary Examiner*—John S. Chu
(74) *Attorney, Agent, or Firm*—Maginot Moore & Beck

(57) ABSTRACT

The subject invention is a system, apparatus and/or method of forming interconnects on a semiconductor wafer. Particularly, the subject invention provides interconnect routing using parallel lines on a semiconductor wafer. The method includes producing a plurality of spaced, parallel interconnects on a wafer, and producing interruptions in selective ones of the plurality of interconnects where the connection should be disrupted. Preferably, the plurality of spaced, parallel lines are formed over the entire die region of the wafer and are spaced from one another by a predetermined width. In one form, a mask having a plurality of spaced, parallel lines may be used.

12 Claims, 8 Drawing Sheets

INTERCONNECT ROUTING USING PARALLEL LINES AND METHOD OF MANUFACTURE

BACKGROUND

1. Field of the Invention

The subject invention relates generally to semiconductor wafer processing for integrated circuits and, more specifically, to interconnect processing for a semiconductor wafer.

2. Background Information

The process of manufacturing semiconductors or integrated circuits (commonly called ICs, or chips) typically consists of more than a hundred steps, during which hundreds of copies of an integrated circuit are formed on a single wafer. Generally, the process involves the creation of eight to twenty patterned layers on and into the substrate, ultimately forming the complete integrated circuit. This layering process creates electrically active regions in and on the semiconductor wafer surface.

The first step in semiconductor manufacturing begins with production of a wafer—a thin round slice of a semiconductor material, usually silicon. In this process, purified polycrystalline silicon is heated to molten liquid. A seed of solid silicon is used to form a single crystal ingot. The crystal ingot is then ground to a uniform diameter and a diamond saw blade cuts the ingot into thin wafers. The wafer is processed through a series of machines, where it is ground smooth and chemically polished to a mirror-like luster. The wafer is then ready to be sent to the wafer fabrication area where it is used as the starting material for manufacturing integrated circuits.

The wafer fabrication facility is where the integrated circuit is formed in and on the wafer. The fabrication process, which takes place in a clean room, involves a series of principle steps described below. Typically, it takes from about ten to thirty days to complete the fabrication process.

A first step in the wafer fabrication process is thermal oxidation or deposition. Wafers are pre-cleaned using high purity, low particle chemicals. The silicon wafer is heated and exposed to ultra-pure oxygen in a diffusion furnace under carefully controlled conditions forming a silicon dioxide film of uniform thickness on the surface of the wafer. The wafer is now ready for masking prior to etching.

Masking is used to protect one area of the wafer while working on another area. This process is referred to as photolithography or photo-masking. A photoresist or light-sensitive film is applied to the wafer, giving it characteristics similar to a piece of photographic paper. A photo aligner aligns the wafer to a mask having a particular pattern thereon. An intense light is then projected through the mask and through a series of reducing lenses, exposing the photoresist with the mask pattern.

The wafer is then developed after exposure. Particularly, the wafer is processed such that the areas of the photoresist that have been exposed to light are either removed (as in the case of positive tone photoresist) or remain (as in the case of negative tone photoresist, in which case those areas not exposed are removed). The wafer is then baked to harden the remaining photoresist pattern. The wafer is then exposed to a chemical solution or plasma (gas discharge) so that areas not covered by the hardened photoresist are etched away. The photoresist is then removed using additional chemicals or plasma. The wafer is then inspected to ensure that image transfer from the mask to the top layer is correct. The wafer is then ready for doping.

Atoms with one less electron than silicon (such as boron), or one more electron than silicon (such as phosphorous) are introduced into the areas exposed by the etch process in order to alter the electrical characteristics of the silicon. These areas are called either P-type (boron) or N-type (phosphorous) to reflect their conducting characteristics.

The thermal oxidation, masking etching, and doping steps are typically repeated several times until the last "front end" layer is completed (i.e. all active devices have been formed). The wafer is then ready for dielectric deposition and metalization.

Following completion of the front end, "back end" processing is started. Back end processing includes steps from the contact layer through completion of the wafer but prior to electrical test. In back end processing, the individual devices formed as indicated above are interconnected using what are known as interconnects. The interconnects are formed in what is known as an interconnect layer. Current semiconductor fabrication includes as many as three interconnect layers separated by dielectric layers.

An interconnect is a metal conductor line that connects elements of the integrated circuit. These lines are delineated in dielectrics that isolate the interconnects from each other. Interconnects may be formed by several processes. In one process, a series of metal depositions and patterning steps of dielectric films (insulators) are provided. This is known as dielectric deposition and metalization. In another process, the interconnects are formed by means of lithography and etching (i.e. metal etching). In yet another process, known as a damascene process, interconnects are formed by lithography, deposition and chemical mechanical polishing or planarization (CMP). Particularly, an interconnect pattern is first lithographically defined utilizing a mask in the layer of dielectric. Then metal such as aluminum or copper is deposited to fill the resulting trenches. The excess metal is then removed by means of CMP.

After the last metal layer is patterned, a final dielectric layer (passivation) is deposited to protect the circuit from damage and contamination. Openings are etched in this film to allow access to the top layer of metal by electrical probes and wire bonds. An automatic, computer-driven electrical test system then checks the functionality of each chip on the wafer. Chips that do not pass the test are marked for rejection.

Thereafter, the wafer is cut into single chips. The functional chips are visually inspected under a microscope before packaging. The chip is then assembled into a package that provides the contact leads for the chip. A wire-bonding machine then attaches wires, a fraction of the width of a human hair, to the leads of the package. Encapsulated with a plastic coating for protection, the chip is tested again prior to delivery to the customer. Alternatively, the chip is assembled in a ceramic package for certain military applications.

In the formation of interconnects, several problems currently exist. One problem is varying metal density of a back end layer. Varying metal density of a back end layer will produce varying interconnect thickness due to CMP processing. In general, interconnects that are crowded together will have similar thickness values. This variation will affect interconnect resistance and capacitance, and thus circuit behavior.

With respect to a damascene copper process, interconnect thickness is a strong function of metal density. Since the metal density in a real chip is often highly non-uniform, the CMP copper process often results in a large amount of metal thickness variations.

One solution to the variation in interconnect thickness is to provide circuit design rules that limit metal density variation in order to keep CMP-induced thickness variations within acceptable limits. This solution, however, is not necessarily practical due to the complexity of current integrated circuit components. Moreover, design rules are difficult to develop and difficult to interpret.

However, in order to attempt to meet the design rule metal density requirements, dummy metals are needed placed in blank areas. Dummy metal placement will increase the layout complexity and overall design time. Moreover, because of the random nature of interconnect routings, metal density variation will still exist even with placement of dummy metals.

According to one aspect, what is therefore needed in view of the above, is a system, method and/or apparatus that provides an almost constant metal pattern density for interconnects and/or an interconnect layer or layers in a semiconductor wafer for integrated circuit manufacture.

Another problem with the interconnect process concerns the masks used to perform interconnect photolithography processing. Because of the complexity of current interconnect routing in modern integrated circuit technology, interconnect layer masks are becoming prohibitively expensive.

One solution to prohibitively expensive interconnect processing masks is to provide multi-purpose masks where one mask can be used for multiple products or layers. This solution, however, is not necessarily practical. Particularly, such multi-purpose masks are still relatively expensive and error-prone. Another solution is to direct-write a pattern onto the whole wafer utilizing a direct-write system. This solution is, as well, impractical. Direct-write systems are inherently slow and thus provide low throughput.

According to another aspect, what is therefore needed in view of the above, is a system, method and/or apparatus that provides interconnects and/or an interconnect layer or layers in a semiconductor wafer having an almost constant metal density.

SUMMARY

According to one aspect of the present principles, the subject invention provides a system, method and/or apparatus of forming interconnects on a semiconductor wafer with an almost constant metal pattern density perfectly suitable for CMP process. The method includes producing a layout on a wafer using only a plurality of spaced, parallel interconnects, and producing interruptions in selective ones of the plurality of interconnects where the connection should be disrupted. Preferably, the plurality of spaced, parallel lines are formed over the entire die region of the wafer and are spaced from one another by a predetermined width.

In one form, the subject invention provides a method of interconnect routing in a semiconductor wafer. The method includes providing a mask having a plurality of spaced, parallel lines; customizing the mask by providing breaks in selective ones of the plurality of spaced, parallel lines according to a design layout; exposing a wafer have a photoresist thereon using the mask; developing the wafer; and providing metallization in channels resulting from the developed wafer.

According to another aspect of the present principles, the plurality of spaced, parallel interconnects are formed on a wafer via a mask having a plurality of parallel lines each one spaced from one another via a predetermined width. The wafer is then exposed utilizing the mask. Interruptions or breaks are produced in selective ones of the plurality of interconnects by a direct-write system. In another form, the spaced, parallel lines are formed by a mask-like system that produces light and dark bands on a wafer. The light and dark bands provide exposed and unexposed bands or strips on the wafer for producing the interconnects and spaces between the interconnects. Pieces of interconnect that are not part of any network will become dummy metal and will be left to float electrically.

According to yet another aspect of the present principles, the subject invention provides a mask for forming interconnects and/or a given interconnect layer on a wafer. The mask consists of a plurality of parallel lines that are spaced from one another via a predetermined width. A mask in accordance with the present principles produces parallel lines of a proper spacing and thickness that run the full length of a die region of the wafer.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views unless specified otherwise.

DESCRIPTION OF THE PREFERRED EMBODIMENT(S)

Figure 1:
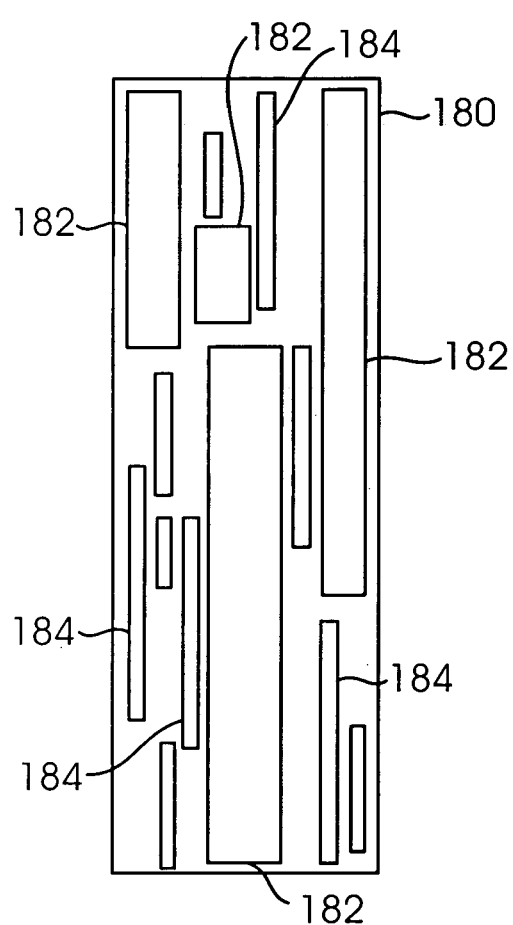
FIG. 1 is a depiction of a prior art layout design of an interconnect layer for an integrated circuit.
Figure 7:
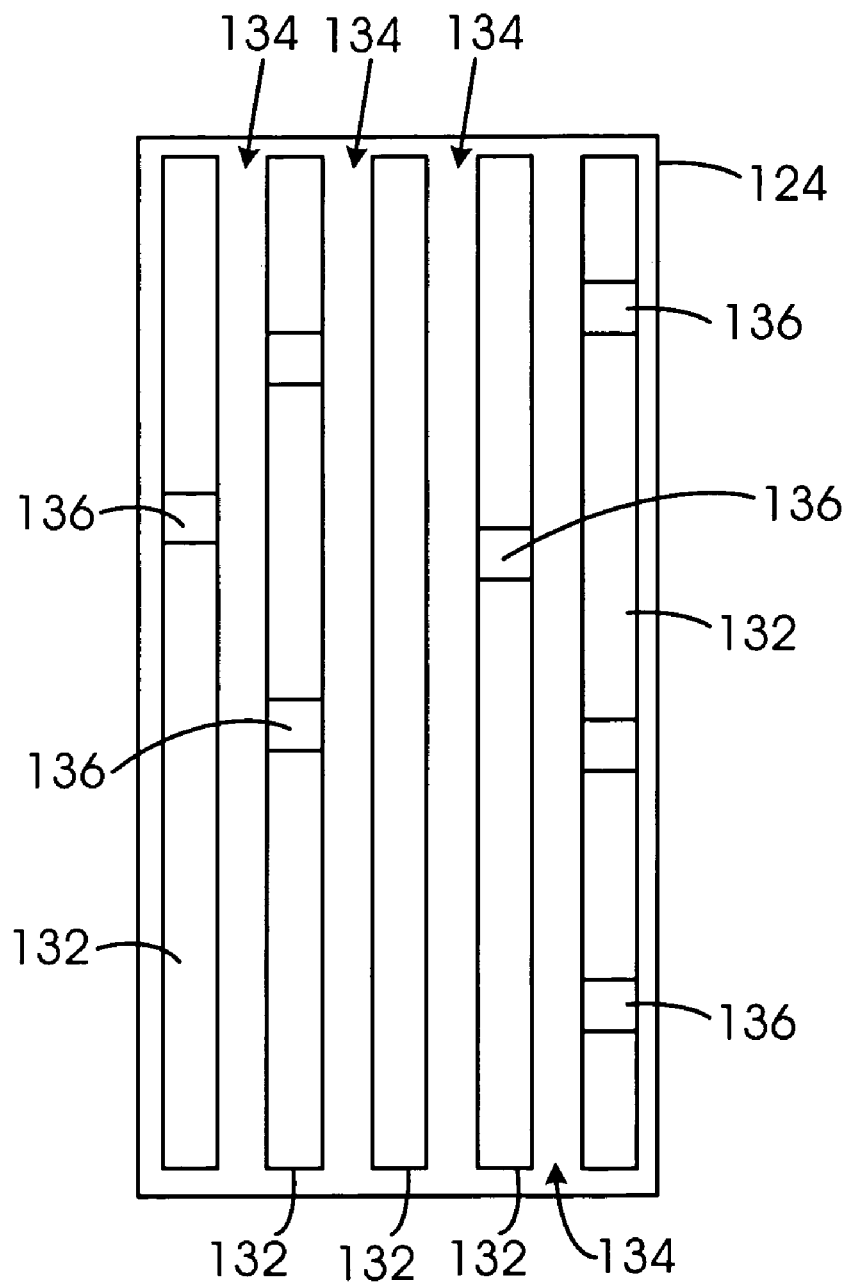
FIG. 7 depicts a top view of the die portion of the wafer of FIG. 5, after processing to provide interruptions in selective ones of the interconnects.

With reference to FIG. 1, there is depicted an interconnect design layout in accordance with a prior art manner of providing interconnects and/or an interconnect layer. Since interconnects connect the various components in an integrated circuit, a routing pattern known as a layout is used. Because interconnects are not distributed evenly over the interconnect layer, achieving consistent metal density of the interconnect required for CMP is difficult. In view of this, prior art design layout provides dummy metal in the interconnect layer in addition to the metal interconnects. FIG. 7 depicts a semiconductor wafer or die region thereof 180. The wafer 180 has a plurality of interconnects 184 distributed unevenly about the wafer due to the particular design layout. A plurality of dummy metal areas 182 are provided to fill in the gaps where there are no interconnects 182. Thus, during CMP there is provided a more even metal surface for polishing/planarization. The problems associated with this manner of providing interconnects or providing interconnect routing, is discussed above.

Figure 2:
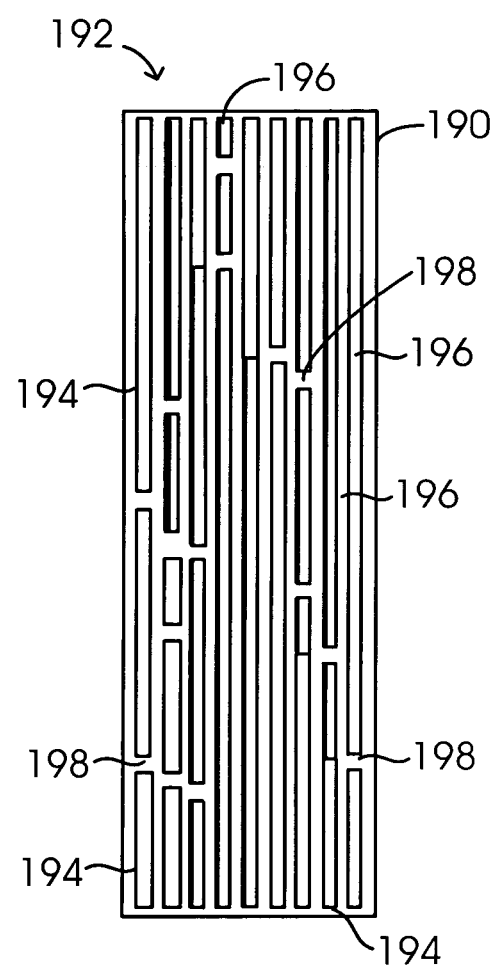
FIG. 2 is a depiction of a layout design of an interconnect layer for an integrated circuit according to one aspect of the principles of the subject invention.

According to an aspect of the subject invention, and referring to FIG. 2, a semiconductor wafer or die region thereof 190 is provided with a plurality of spaced, parallel metal lines or channels that are to become metal lines or interconnects 192. A plurality of interruptions or breaks 198 are provided in the plurality of metal lines (interconnects) 192. Additionally, some of the metal lines 194 are actually utilized as interconnects, while some of the metal lines 196 are dummy interconnects. By using the parallel line architecture of FIG. 2, an almost constant metal pattern density which is perfectly suitable for CMP process is achieved. Further, there is little to no thickness variations due to layout pattern density variation. Moreover, there is no need for additional dummy metal placement in the design flow. Timing analysis becomes more accurate and also independent of layout pattern density. The overall time to market will also be less because of the above reasons in reducing design time.

Figure 3:
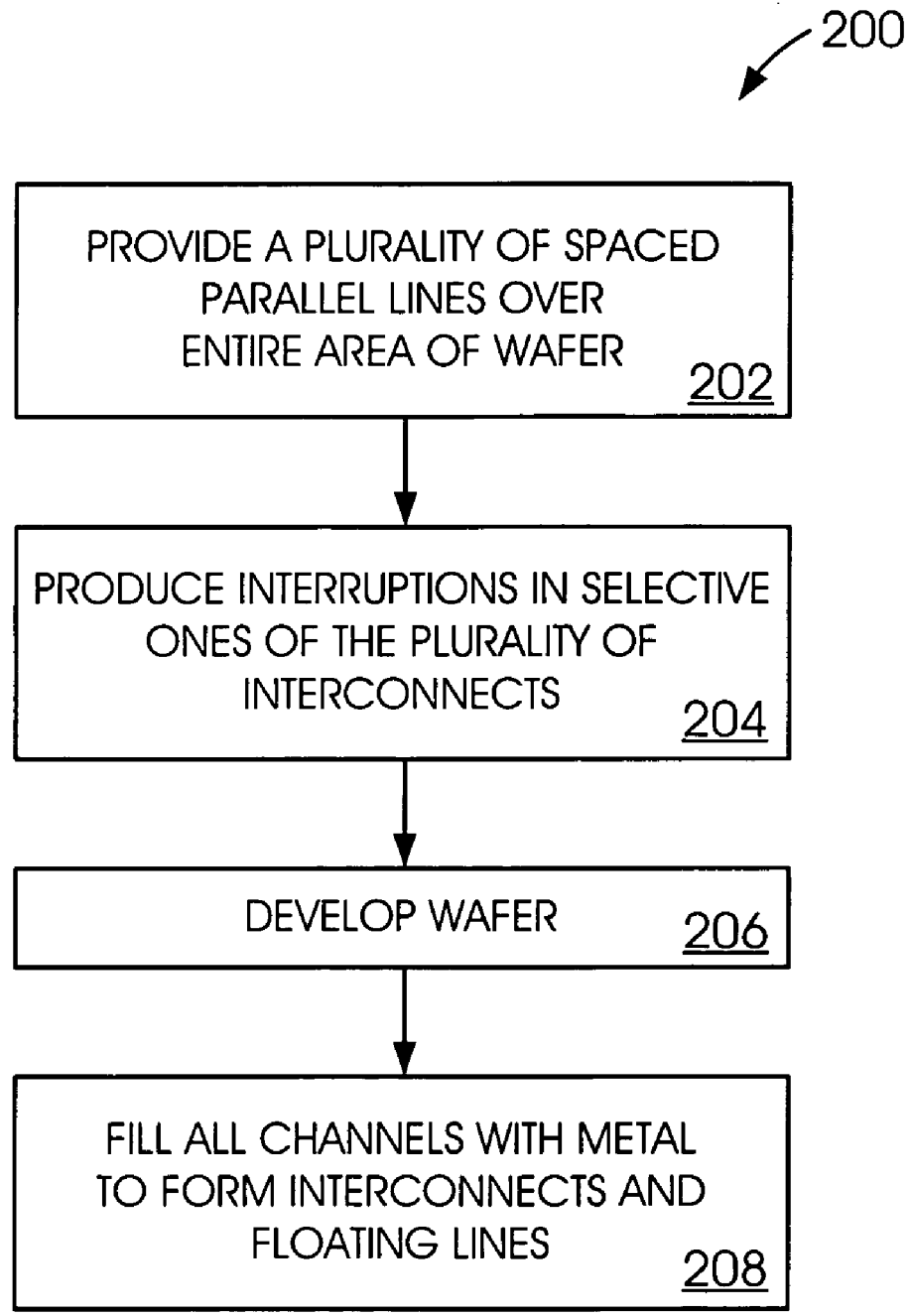
FIG. 3 is a flowchart of an exemplary manner of forming interconnects on a semiconductor wafer in accordance with one aspect of the principles of the subject invention.

FIG. 3 depicts a flowchart, generally designated 200, illustrating a manner of the subject interconnect parallel lines routing method. In step 202, a plurality of spaced, parallel lines are formed over entire area of the wafer/die region. In step 204, a plurality of interruptions are formed in selective ones of the plurality of lines. Thereafter, in step 206, the wafer is developed. The resulting channels (lines) are filled with metal to form an interconnect layer and/or interconnects and dummy lines.

Alternative manners of usage of the above includes time savings in producing a mask for an interconnect layer as explained thereafter.

Figure 4:
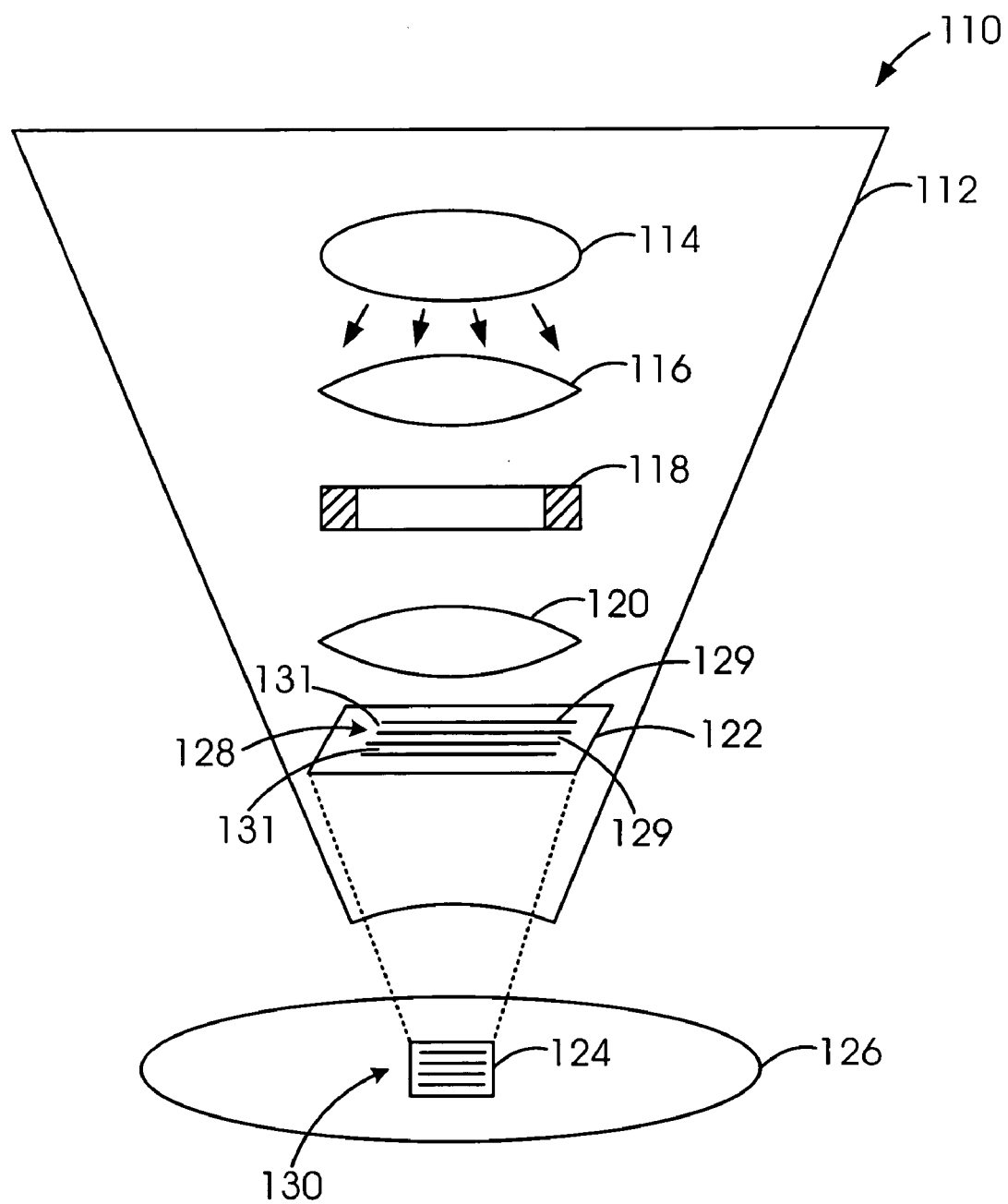
FIG. 4 is an illustration of an exemplary photolithography system operative to perform photolithography in accordance with the principles of the subject invention.

With reference now to FIG. 4, there is shown an exemplary photolithography system, generally designated 110, which may be used to implement the subject invention in accordance with the present principles. It should be appreciated that the photolithography system 110 is only exemplary of an imaging system for semiconductor wafers that is operative, configured and/or adapted to carry out the principles of the subject invention. Therefore, other imaging systems may be used, and are contemplated, that are likewise operative, configured and/or adapted to carry out the principles of the subject invention as described herein. Particularly, the system 110 is operative as one step in the formation of interconnects on a semiconductor wafer.

The photolithography system 110 includes a scanner system 112, which is also known as a stepper apparatus. A light source or irradiator 114 is commonly positioned near a top region of the scanner system 112 in order to allow produced light waves to be directed toward a first lens system 116. The light source 114 is operative, configured and/or adapted to provide light or radiation of a single wavelength or of a range of wavelengths, depending on a desired resolution and/or application. The light source 114 may thus produce X-ray, UV, or electron bean radiation. Particularly, but not necessarily, the light source 114 may produce or provide wavelengths of light or radiation in the deep UV range (i.e. 248 nanometers (nm)) and smaller. Alternatively, the light source may produce or provide wavelengths of light or radiation in the I-line (i.e. 364 nm). It should be appreciated that the above wavelengths are merely examples of the typical wavelengths of light or radiation utilized by photolithography systems. The subject invention is applicable to all wavelengths of light/radiation used in various photolithography systems.

From the first lens system 116, the light/radiation (hereinafter collectively, "light") is projected through a pupil aperture 118. The pupil aperture 118 is operative, configured and/or adapted to better or more precisely directs the light onto a second lens system 120. As is well known, the pupil aperture 118 assists in precisely directing the light source onto the desired location of a mask 122.

The mask 122 is used to define interconnects on a wafer 126. According to an aspect of the subject invention, the mask 122 has a patterned geometry 128 thereon. Particularly, the patterned geometry is a plurality of lines, strips, bands or the like 129 separated from one another by a space 131. Preferably, but not necessarily, the spaces 131 are the same width such that the lines 129 are regularly spaced from one another. The lines 129 are of sufficient length to preferably, but not necessarily, run the length of a die portion 124 on the wafer 126. The width of the lines 129, in one form, defines the width of the interconnects, while the width of the spaces 131 defines the width of a dielectric portion between the interconnects. This is true if a positive tone photoresist is used on the wafer 126. With a negative tone photoresist, the spaces would define the interconnects, while the lines would define the dielectric.

After the desired light passes through the mask 122, the light leaves the scanner system 112 and comes into contact with the die region 124 of the semiconductor wafer 126. For ease of illustration, only one die region 124 is shown, but as is well known in the art, many more die regions are formed throughout the semiconductor wafer 126 during normal fabrication.

The mask 122 may be formed of a substance that allows light to pass therethrough. The lines are formed of a substance that blocks light from passing therethrough. In this manner, the die region 124 has a projected pattern 130 thereon. The projected pattern 130 is regularly spaced lines.

In one form, the mask 122 is a glass plate while the lines 129 are typically, but not necessarily, defined by a chromium material which blocks the light from propagating through the lines 129 of the mask 122. The mask 122 is patterned according to an interconnect layer for the die region 124.

The wafer 126, and particularly the die region 124, has a thin film of metal provided thereon which is then coated with a photoresist. While both positive and negative tone photoresists may be used, it is assumed herein that a positive tone photoresist is used. Thus, exposure of the photoresist to light and then developing, removes the photoresist at those portions (i.e. lines) and the thin film metal thereunder.

According to one aspect of the plurality of lines architecture represented in FIG. 2, a raw mask with all parallel lines can be built in advance, before completion of the design layout. Then, after completion of the design layout, the mask can be customized using mask repair techniques to cut the lines according to the layout. In this manner, since all designs use the same raw mask, it will expedite the design time to market. Moreover, it will potentially reduce the cost of the mask, since only one type of raw mask will be needed for all different products.

Figure 5:
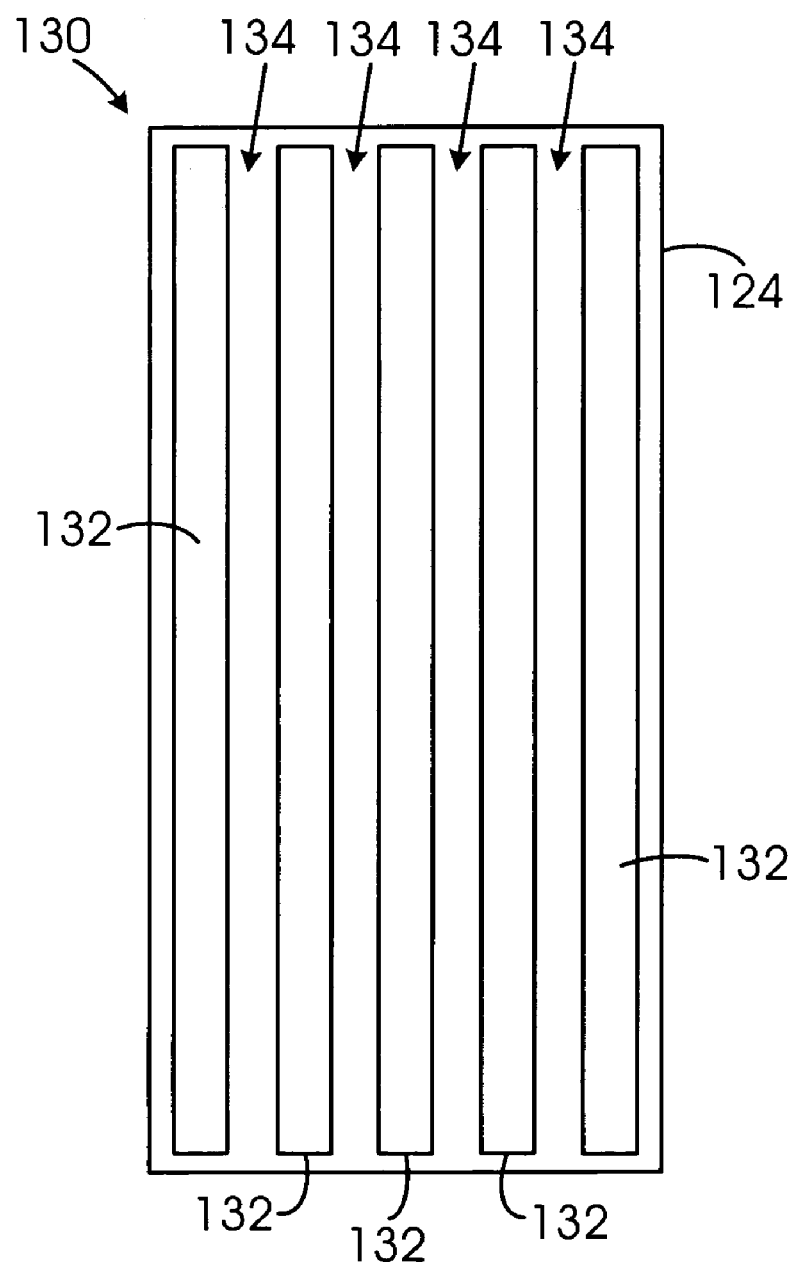
FIG. 5 is a top view of the die portion of the wafer of FIG. 4 having a plurality of continuous, parallel interconnects formed thereon in accordance with an aspect of the principles of the subject invention.

According to another aspect of this invention a combination of mask printing and direct-write system is used. Referring to FIG. 5, there is shown the die region 124 after exposure and developing. The die region 124 has a plurality of parallel metal interconnects (lines) 132 corresponding to the lines 129 of the mask, and a plurality of parallel spaces 134 corresponding to the spaces 131 of the mask. The plurality of interconnects 132 preferably extend the length of the die region 124. Once the plurality of metal interconnects 132 have been formed, interruptions or breaks are formed in selective ones of the plurality of interconnects 132. This may be accomplished in a variety of manners such as are known in the art. Preferably, however, and in accordance with an aspect of the subject invention, the interruptions or breaks are formed by a direct-write system.

Figure 6:
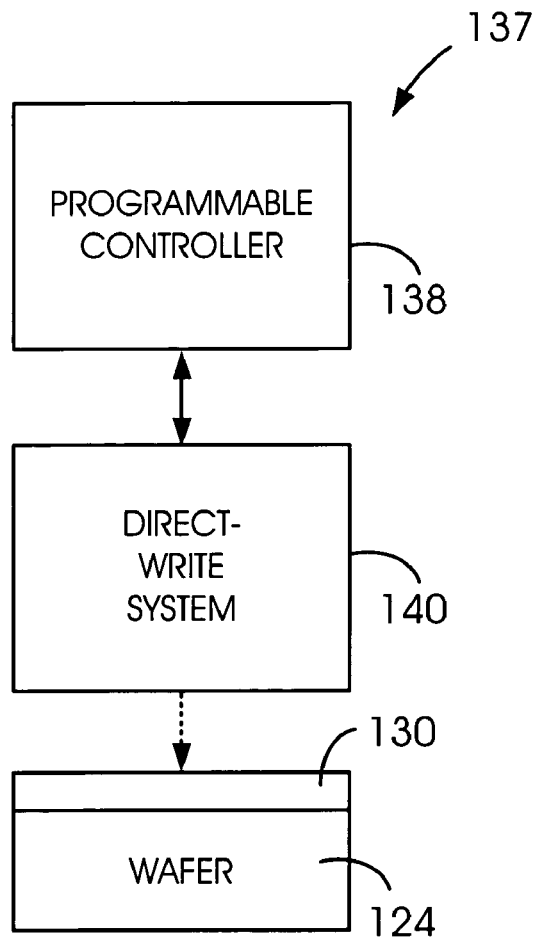
FIG. 6 is block diagram of a system used to provide the interruptions in selective ones of the interconnects as depicted in FIG. 7.

Referring to FIG. 6, there is depicted a block diagram of a system, generally designated 137, for providing the interruptions in the metal interconnects 132. The system 137 includes a direct-write system 140 such as is known in the art. The direct-write system 140 is under the control of a programmable controller 138. The programmable controller is operative to be programmed to provide control signals to the direct-write system 140 in order to selectively remove a portion of an interconnect. In this manner, networks of usable and unusable interconnects/interconnect portions are formed. Pieces of interconnect that are not part of any network become dummy metal and will be left to float electrically.

FIG. 6 depicts the die region 124 of the wafer 126 with its pattern 130 formed thereon being processed by the direct-write system 140. The direct-write system 140 may use an electron beam (represented by the dashed arrow emanating from the direct-write system and directed toward the die region 124 of the wafer 126) in order to make the interruptions or breaks in the interconnects. Of course, other types of direct-write systems, as well as other types of systems capable of providing such interruptions in interconnects, may be used and are contemplated. The direct-write system 140 may also provide vias in the die region 124.

Referring to FIG. 7, there is depicted the die region 124 of the wafer 126 after being processed by the direct-write system 140). Each interconnect 132 may have from zero to any number of interruptions 136 formed by the direct-write system 140 depending on design criteria. In this manner, interconnection portions defining a network or networks in an interconnect layer of the die region 124 (eventually an IC). Portions of the interconnects may not be part of a network and thus are electrically isolated. These unused portions become dummy metal and are left to float electrically. Thus, in this manner, a simple mask that consists of parallel lines and a programmable direct-write system can provide interconnects on a semiconductor wafer.

Figure 8:
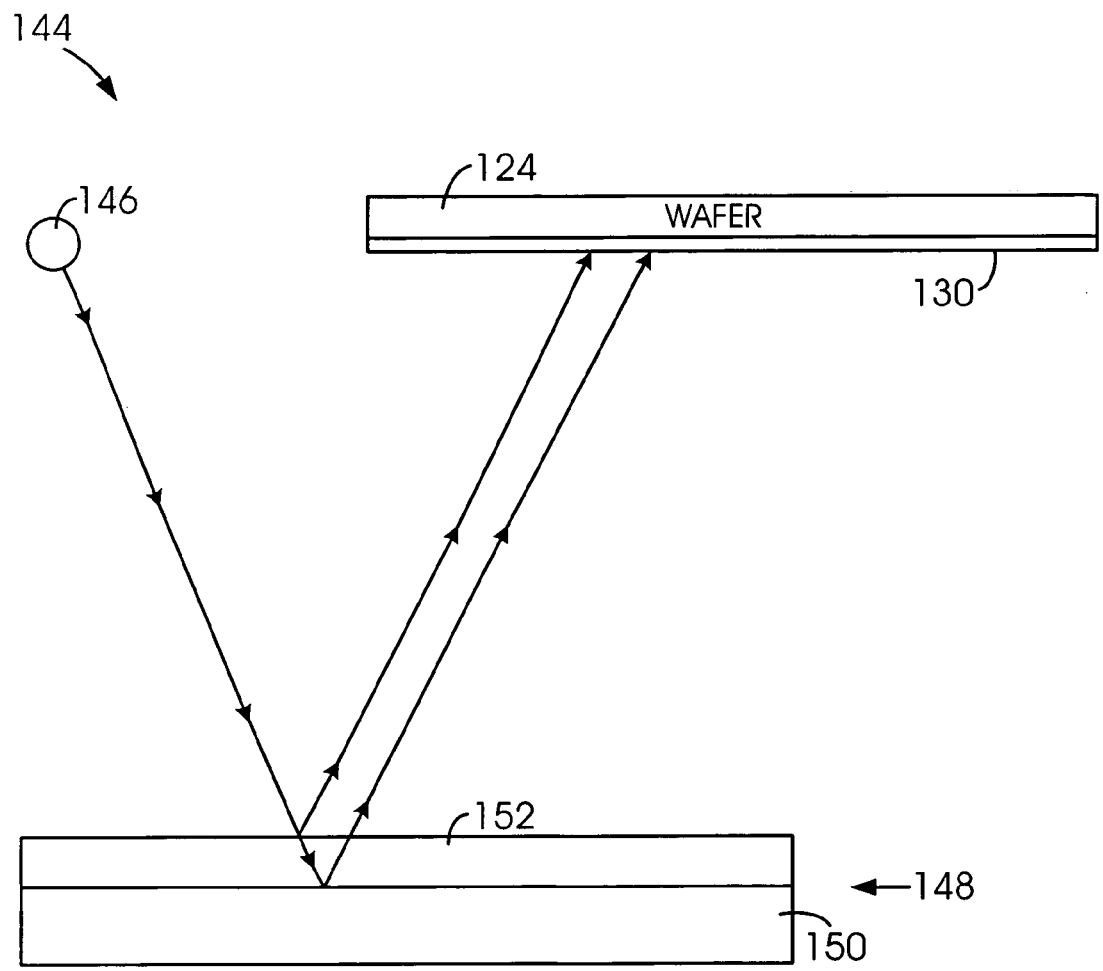
FIG. 8 is a diagram of an alternative manner of providing a plurality of continuous, parallel alternating lines and spaces in accordance with the principles of the subject invention.

Referring to FIG. 8, there is depicted an alternative manner of forming the plurality of parallel lines and spaces on the wafer prior to processing by the direct-write system 137. Particularly, there is depicted a system 144 that provides parallel, alternative lines and spaces (pattern 130) on the die region 124 of the wafer 126. The system 144 includes a light source 146 that is operative to provide light and, preferably, directed light. A reflective device 148 having a reflective surface 150 and a partially reflective coating 152 over the reflective surface 150 is also provided.

The reflective device 148 is operative, configured and/or adapted to provide exposed and unexposed areas on the die region 124 by the difference in the reflection of light off of the reflective surface 150 and the partially reflective coating 152. Some of the light from the light source 146 is transmitted through the partially reflective coating 152 and reflects off of the reflective surface 150 to then travel back through the partially reflective coating 152 and strike the die region 124. Some of the light is also directly reflected by the partially reflective coating toward the die region 124. This is represented by the dual arrows emanating from the surface 150 and the partially reflective coating 152 toward the die region 124 of the wafer 126.

Figure 9:
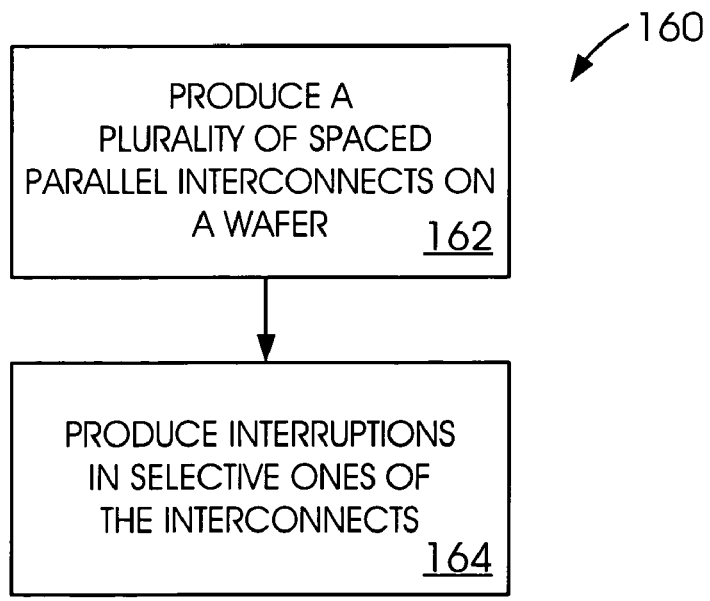
FIG. 9 is a flowchart of an exemplary general manner of forming interconnects on a semiconductor wafer in accordance with one aspect of the principles of the subject invention.

In FIG. 9, there is depicted a flowchart, generally designated 160 of a general manner of forming interconnects on a semiconductor wafer in accordance with one aspect of the principles of the subject invention. In step 162, a plurality of spaced, parallel interconnects are produced on a semiconductor wafer. Thereafter, in step 164, interruptions or breaks are formed in selective ones of the interconnects. Particularly, one or more interruptions are formed in certain interconnects according to a particular design layout. As well, a particular interconnect may not have an interruption.

Figure 9A:
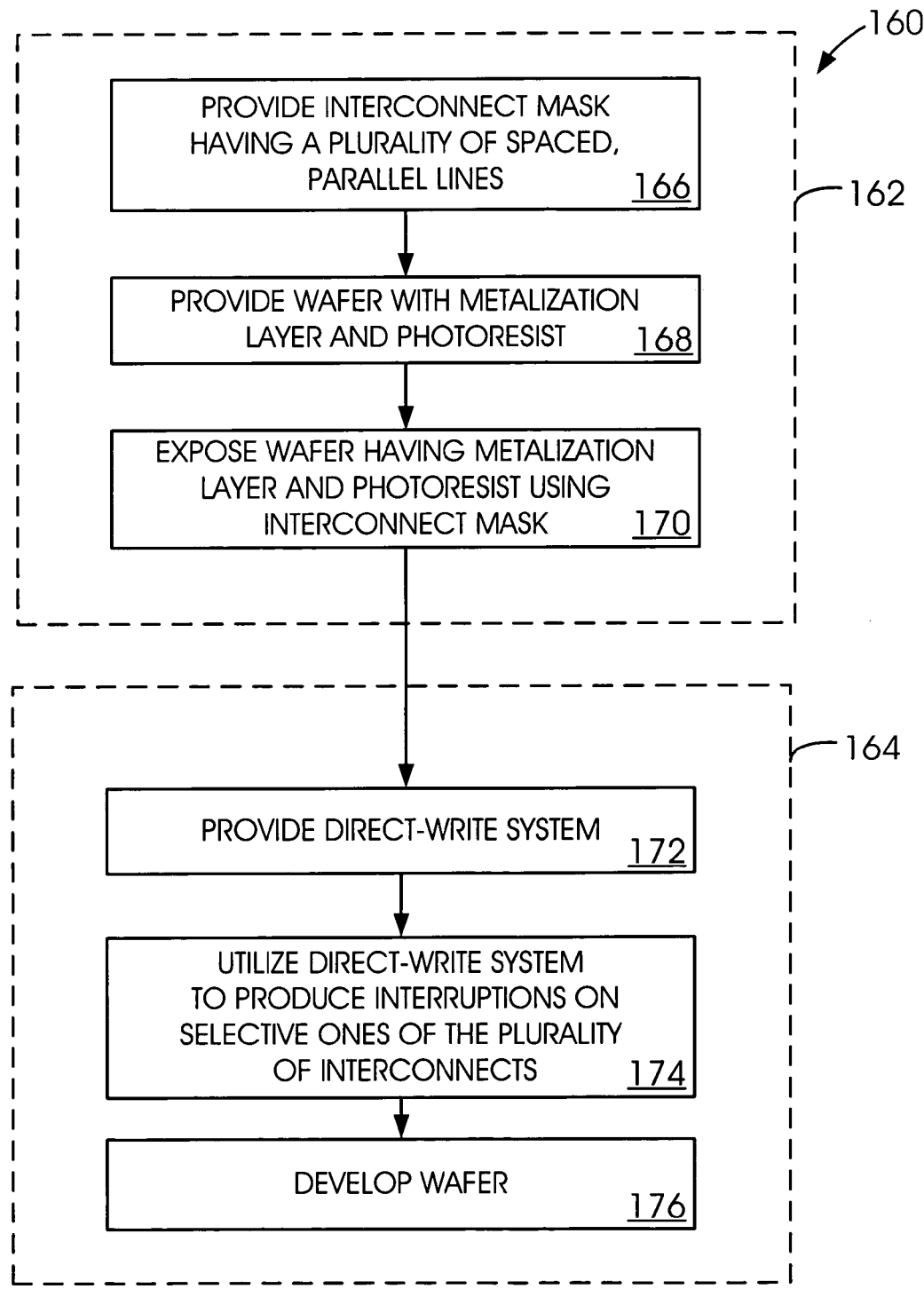
FIG. 9A is an expanded flowchart of FIG. 9 delineating a particular manner of forming interconnects on a semiconductor wafer in accordance with the principles of the subject invention.

Referring now to FIG. 9A, a more detailed manner of forming interconnects on a semiconductor wafer within the parameters of the flowchart 160 of FIG. 9 is shown. Particularly, steps 162 and 164 have been broken down into three sub-steps each. More particularly, the step of producing a plurality of spaced, parallel interconnects (i.e. step 162) includes providing an interconnect mask having a plurality of spaced, parallel lines as per step 166. In step 168, a wafer having a metalization layer (thin film metal layer) and a photoresist layer is provided. In step 170, the wafer is exposed using photolithography and the provided mask.

With respect to step 164 (i.e. producing interruptions in selective ones of the plurality of interconnects), in step 172 a direct-write system is provided. In step 174, the direct-write system is utilized to produce breaks or interruptions on selective ones of the plurality of interconnects. The direct-write system essentially "spot exposes" an interconnect at a particular location depending on the desired design layout. After all of the interrupts have been produced, in step 176, the wafer is developed. The portions of the photoresist that have been exposed are removed while the portions of the photoresist that have not been removed remain with the metal pattern (interconnects or interconnect layout) remaining. The channels or portions remaining after the removal of the photoresist are filled with a dielectric.

While this invention has been described as having a preferred design and/or configuration, the subject invention can be further modified within the spirit and scope of this disclosure. This application is therefore intended to cover any variations, uses, or adaptations of the invention using its general principles. Further, this application is intended to cover such departures from the subject disclosure as come within known or customary practice in the art to which this invention pertains and which fall within the limits of the appended claims.

What is claimed is:

1. A method of forming interconnects on a semiconductor wafer comprising the steps of:
   producing an interconnect layout on a semiconductor wafer using only a plurality of equally spaced, parallel interconnects over an entire die region of the semiconductor wafer, each interconnect having a same predetermined width; and
   producing openings in selective ones of the plurality of interconnects where connection should be disrupted.

2. The method of claim 1, wherein the step of producing an interconnect layout on a semiconductor wafer utilizes a mask having a plurality of equally spaced, parallel lines, and a photolithography system.

3. The method of claim 2, wherein the step of producing openings in selective ones of the plurality of interconnects where connection should be disrupted, includes providing breaks in selective ones of the plurality of equally spaced, parallel lines of the mask.

4. The method of claim 1, wherein the step of producing an interconnect layout on a semiconductor wafer utilizes a light and dark band projection system.

5. The method of claim 1, wherein producing openings in selective ones of the plurality of interconnects where connection should be disrupted includes utilizing a direct-write system to produce the openings.

6. A method of forming interconnects on a semiconductor wafer comprising the steps of:

providing a mask having a plurality of parallel lines, each parallel line spaced from one another by a predetermined width;

providing a semiconductor wafer having a metal thin film layer and a photoresist layer over the metal thin film layer;

exposing the semiconductor wafer to light utilizing the mask to form a plurality of exposed parallel lines and a plurality of unexposed parallel lines;

developing the wafer to obtain a plurality of interconnects corresponding to the plurality of unexposed parallel lines; and forming interruptions in selective ones of the plurality of interconnects.

7. The method of claim 6, wherein the step of providing a mask having a plurality of parallel lines, each parallel line spaced from one another by a predetermined width that provide equal spacing between the parallel lines.

8. The method of claim 6, wherein the step of providing a mask having a plurality of parallel lines, each parallel line spaced from one another by a predetermined width that provides equal spacing between the parallel lines, includes providing a plurality of lines each having a predetermined width with each predetermined width being equal.

9. The method of claim 6, wherein forming interruptions in selective ones of the plurality of interconnects includes utilizing a direct-write system to produce the interruptions.

10. A method of interconnect routing in a semiconductor wafer comprising:

providing a mask having a plurality of spaced, parallel lines;

customizing the mask by providing breaks in selective ones of the plurality of spaced, parallel lines according to a design layout;

exposing a wafer have a photoresist thereon using the mask;

developing the wafer; and providing metallization in channels resulting from the developed wafer.

11. The method of claim 10, wherein the step of providing a mask having a plurality of spaced, parallel lines includes providing a mask having a plurality of spaced parallel lines with each parallel line spaced from one another by a predetermined width that provide equal spacing between the parallel lines.

12. The method of claim 10, wherein the step of providing a mask having a plurality of spaced, parallel lines includes providing a mask having a plurality of spaced, parallel lines each having a predetermined width with each predetermined width being equal.

* * * * *